(12) United States Patent
Ong et al.

(10) Patent No.: US 7,961,057 B2
(45) Date of Patent: Jun. 14, 2011

(54) VOLTAGE CONTROLLED OSCILLATOR

(75) Inventors: Beng Hwee Ong, Singapore (SG); Minjie Wu, Singapore (SG); Wee Liang Lien, Singapore (SG); Chang-Fu Kuo, Hsinchu (TW)

(73) Assignee: Mediatek Singapore Pte Ltd, Ayer Rajah Crescent (SG)

( * ) Notice: Subject to any disclaimer, the term of this patent is extended or adjusted under 35 U.S.C. 154(b) by 168 days.

(21) Appl. No.: 12/200,009

(22) Filed: Aug. 28, 2008

(65) Prior Publication Data

US 2010/0052803 A1 Mar. 4, 2010

(51) Int. Cl.
*H03B 19/12* (2006.01)
(52) U.S. Cl. .......... 331/51; 331/16; 331/175; 331/177 R
(58) Field of Classification Search .................... 331/16, 331/51, 175, 177 R
See application file for complete search history.

(56) References Cited

U.S. PATENT DOCUMENTS

| | | | | |
|---|---|---|---|---|
| 6,765,448 | B2 * | 7/2004 | Wu et al. ................. | 331/117 FE |
| 2004/0041593 | A1 * | 3/2004 | Lai ............................ | 326/115 |
| 2005/0264321 | A1 * | 12/2005 | Lee ........................... | 326/115 |
| 2007/0132515 | A1 * | 6/2007 | Lee et al. .................. | 331/1 A |
| 2008/0266002 | A1 * | 10/2008 | Liu et al. .................. | 331/25 |
| 2009/0021317 | A1 * | 1/2009 | Hsieh ....................... | 331/117 FE |
| 2009/0284288 | A1 * | 11/2009 | Zhang et al. ............. | 327/118 |

OTHER PUBLICATIONS

Author: Chihun Lee, Lan-Chou Cho and Shen-luan Liu Title: A 44GHz Dual-Modulus Divide-by-4/5 Prescaler in 90nm CMOS Technology Date: 2006 Publisher: IEEE 2006 Custom Integrated Circuits Conference pp. 397-400.*
Author: Changhua Cao, Kenneth K. O Title: A Power Efficient 26-GHz 32:1 Static Frequency Divider in 130-nm Bulk CMOS Date: Nov. 2005 Publisher: IEEE Microwave and Wireless Components Letters vol. 15, No. 11.*
Liscidini et al. "A 5.4 4mW GRS COMOS Quadrature Front-End Based on a Single-Stage LNA-Mixer-VCO" ISSCC2006, Session 26, Cellular Building Blocks and Socs, 26.2, 2006 IEEE International Solid-State Circuits Conference.

* cited by examiner

*Primary Examiner* — Arnold Kinkead
*Assistant Examiner* — Richard Tan
(74) *Attorney, Agent, or Firm* — Thomas | Kayden

(57) ABSTRACT

An integrated circuit and an apparatus are provided. The integrated circuit comprises a bias circuit, an LC resonator circuit, and a current mode logic (CML) frequency divider. The bias circuit generates first and second bias voltages. The LC resonator circuit generates an oscillation signal having an oscillation frequency. The CML frequency divider, coupled to the bias circuit and the LC resonator circuit, biased by the first and second bias voltages, receives the oscillation signal to generate an output signal having an output frequency with a fractional rate of the oscillation frequency. The oscillation signal comprises AC and DC components, the CML frequency divider receives the AC component to determine an injected frequency and reuses the DC component to provide tail currents to determine a natural frequency of the CML frequency divider. The output frequency is determined by the injected frequency and the natural frequency.

14 Claims, 2 Drawing Sheets

VOLTAGE CONTROLLED OSCILLATOR

BACKGROUND OF THE INVENTION

1. Field of the Invention

The invention relates in general to high speed communications, and in particular, to a voltage controlled oscillator utilized in high speed communications.

2. Description of the Related Art

Requirement for transmission of high-speed data has increased in recent years, for applications such as computers, telecommunication devices, RF IC technologies, and high-frequency clocks. High-speed voltage controlled oscillators and frequency dividers are essential building blocks commonly employed in computer and telecommunication applications for functions such as frequency synthesis, up-conversion and down-conversion. For example, a prescaler implemented by a frequency divider is one of the important components in a phase-locked loop (PLL) (FIG. 1), widely used as frequency synthesizers in a radio transceiver. Static or dynamic digital frequency dividers are commonly used in RF/microwave PLLs. They have simple structures, large bandwidths, and good robustness over process variations. However, as radio operation frequencies increase beyond the low GHz range, power consumption of digital dividers becomes a problem. Namely, it becomes increasingly difficult for digital frequency dividers to meet power requirements, with the problem particularly challenging for low-powered mobile applications. Furthermore, due to large power dissipation, high-speed digital dividers may also result in considerable noise degradation.

Voltage controlled oscillators typically utilize inductors and capacitor banks to form a resonance network, and generate high-frequency oscillation signals. Generally, the inductors and capacitor banks occupy large circuit areas when compared with other circuits in an IC, resulting in requirement for larger IC circuit dimensions, thus raising manufacturing costs.

Thus, a voltage controlled oscillator and frequency divider with better power efficiency and a more compact circuit dimension is needed.

BRIEF SUMMARY OF THE INVENTION

A detailed description is given in the following embodiments with reference to the accompanying drawings.

An integrated circuit is disclosed, comprising a bias circuit, an LC resonator circuit, and a current mode logic (CML) frequency divider. The bias circuit generates first and second bias voltages. The LC resonator circuit generates an oscillation signal having an oscillation frequency. The CML frequency divider, coupled to the bias circuit and the LC resonator circuit, biased by the first and second bias voltages, receives the oscillation signal to generate an output signal having an output frequency with a fractional rate of the oscillation frequency. The oscillation signal comprises AC and DC components, the CML frequency divider receives the AC component to determine an injected frequency and reuses the DC component to provide tail currents to determine a natural frequency of the CML frequency divider, and the output frequency is determined by the injected frequency and the natural frequency.

An apparatus is disclosed, comprising a phase detector, an LC resonator circuit, a bias circuit, and a CML frequency divider. The phase detector detects a phase difference signal between a reference signal and an output signal. The bias circuit generates first and second bias voltages. The LC resonator circuit coupled to the phase detector, receives the phase difference signal generates an oscillation signal having an oscillation frequency. The CML frequency divider, coupled to the bias circuit and the LC resonator circuit, biased by the first and second bias voltages, receives the oscillation signal to generate an output signal having an output frequency with a fractional rate of the oscillation frequency. The oscillation signal comprises AC and DC components, the CML frequency divider receives the AC component to determine an injected frequency and reuses the DC component to provide tail currents to determine a natural frequency of the CML frequency divider, and the output frequency is determined by the injected frequency and the natural frequency.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
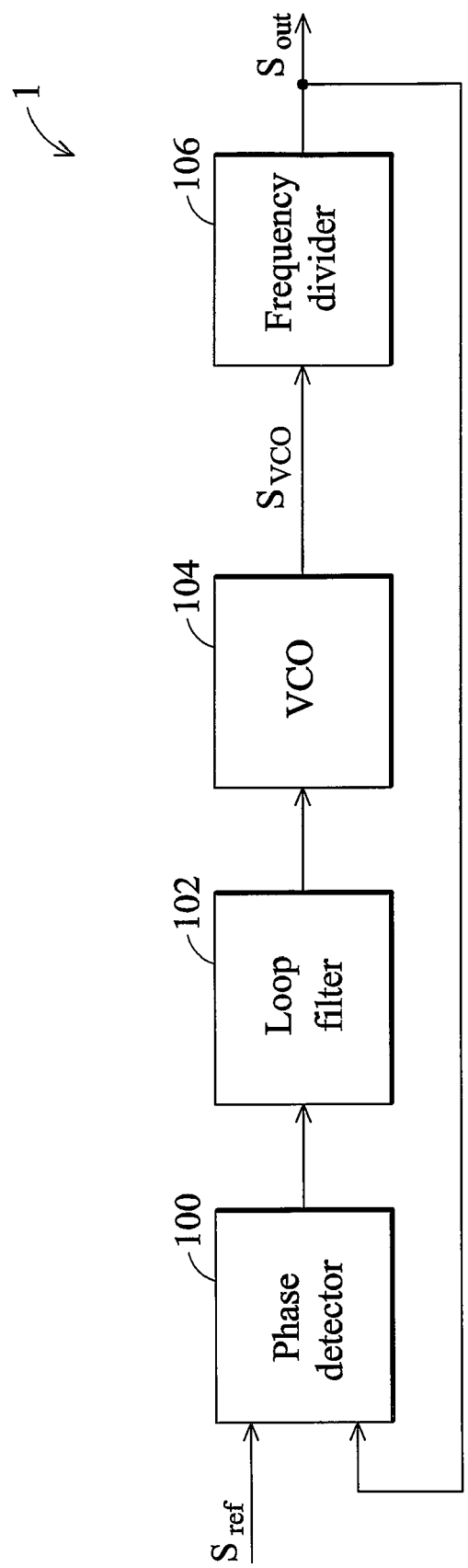
FIG. 1 is a block diagram of an exemplary phase locked loop.

FIG. 1 is a block diagram of an exemplary phase locked loop (PLL), comprising phase detector 100, loop filter 102, voltage controlled oscillator 104, and frequency divider 106, coupled in a loop.

Voltage controlled oscillator 104 may be an LC resonator producing an oscillation signal $S_{VCO}$. Frequency divider 106 divides the oscillation signal $S_{VCO}$ frequency, e.g., by 2, to produce output signal $S_{OUT}$. Frequency divider 106 may be a current mode logic (CML) divider using a differential architecture. The circuit implementation in FIG. 1 requires less capacitance in voltage controlled oscillator 104, reducing circuit area requirement and manufacturing cost for the capacitor bank in the LC resonator.

Figure 2:
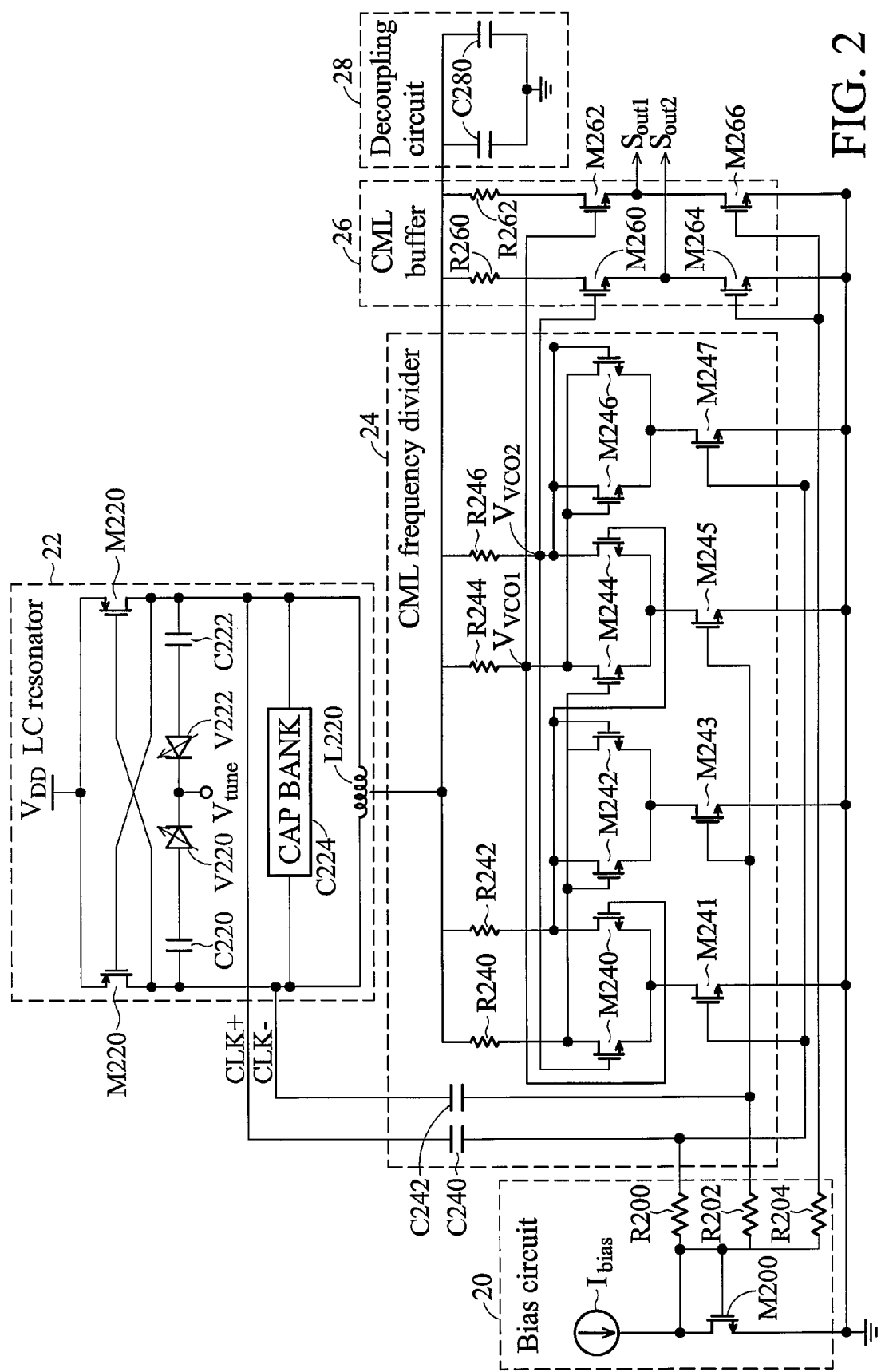
FIG. 2 is a block diagram of an exemplary voltage controlled oscillator and CML divider according to the invention.

FIG. 2 is a block diagram of an exemplary voltage controlled oscillator and CML divider according to the invention, comprising bias circuit 20, LC resonator 22, CML frequency divider 24, CML buffer 26, and decoupling circuit 28. Bias circuit 20 is coupled to LC resonator 22 and CML frequency divider 24, and both are coupled to CML buffer 26, subsequently to decoupling circuit 28.

Bias circuit 20 comprises current source $I_{bias}$, transistor M200, and bias resistors R200 to R204, providing bias currents to CML frequency divider 24. Current source $I_{bias}$ and transistor M200 provides current mirror bias to establish bias voltages through resistors R200 to R204. The bias voltage may be identical or different, depending on the circuit requirement.

LC resonator 22 is an LC tank resonator generating an oscillation signal at an oscillation frequency. LC resonator 22 comprises PMOS cross-coupled transistors M220, capacitors C220 and C222, varactors V220 and V222, capacitor bank C224, and inductor L220. PMOS cross-coupled transistors M220 provide a negative $g_m$ to degenerate the resistive energy loss in LC resonator 22. LC resonator 22 may further comprise NMOS cross-coupled transistors (not shown) as an alternative to the PMOS cross-coupled transistors. In practice, PMOS cross-coupled transistors provide better flicker noise performance than NMOS cross-coupled transistors. The oscillation frequency of the oscillation signal can be fine tuned by controlling voltage $V_{tune}$. The oscillation signal comprises differential signal pair CLK+ and CLK−. The oscillation signal comprises AC and DC components, CML frequency divider 24 receives the AC component to determine an injected frequency and reuses the DC component to provide tail currents to determine a natural frequency of the CML frequency divider, and an output frequency of CML frequency divider 24 is determined by the injected frequency and the natural frequency. The center tap of inductor L220 is coupled to CML frequency divider 24 through capacitors C280, so that all DC currents therein flow through CML frequency divider 24 to ground. Since bias circuit 20 controls bias current generation to transistors M241 through M247, the total amount of DC currents in CML frequency divider 24 equal to the total amount of DC currents in LC resonator 22, both limited by bias circuit 20.

CML frequency divider 24 is AC coupled to LC resonator 22 to receive differential oscillation signals CLK+ and CLK− through capacitors C240 and C242. CML frequency divider 24 is two D flip-flops realized by CML circuits feeding back differential signal output $V_{VCO1}$ and $V_{VCO2}$ to input terminals thereof. CML frequency divider 24 operates in track and latch modes determined by oscillation signal pair CLK+ and CLK−. During the track mode, signal CLK+ is "HIGH" and signal CLK− is "LOW", transistor M241 is turned on and transistor M243 is off, allowing the drain currents of transistors M240 to track output voltage pair $V_{VCO1}$ and $V_{VCO2}$, thereby establishing output drain voltages through resistors R240 and R242. During the latch mode, signal CLK+ is "LOW" and signal CLK− is "HIGH", transistor M241 is turned off and transistor M243 is on, enabling latch transistor pair M242 to latch the output drain voltage of previous transistor stage M240. Likewise, when signal CLK+ is "LOW" and signal CLK− is "HIGH", transistor M245 is turned on and transistor M247 is off, allowing transistors M244 to track the output drain voltages of transistors 240 and establish output drain voltages through resistors R244 and R246. When signal CLK+ is "HIGH" and signal CLK− is "LOW", transistor M245 is turned off and transistor M247 is on, enabling transistors M246 to latch the output drain voltage of previous transistor stage M244 and output output voltage pair. Resistors R240 through R246 are not only employed to determine a natural frequency of the output signal pair, but also serve to isolate the output signal pair from LC resonator 22.

When the oscillation signal has zero amplitude, CML frequency divider 24 generates output signal pair having the natural frequency determined by load resistors R240 through R246, small-signal transconductance $g_m$, and gate and wire capacitance, known as self-oscillation. As amplitude of the oscillation signal increases, CML frequency divider 24 experiences an "injection locking effect". Due to injection of the input oscillation signals CLK+ and CLK−, CML frequency divider 24 behaves as an oscillator with an output clock frequency of the output signals pulled from the natural frequency to oscillate at a half-rate frequency of input oscillation signals CLK+ and CLK−, rendering a divide-by-2 frequency divider.

CML buffer 26 operates with small voltage swings, $2V_{THN}$ peak-to peak differential mode, with voltage $V_{THN}$ being the threshold voltage of NMOS transistors 260 to 266, thereby providing high speed oscillation outputs $S_{OUT1}$ and $S_{OUT2}$.

Decoupling circuit 28 is coupled to the center tap of inductor L220, providing a virtual ground for AC signals from LC resonator 22.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, comprising:
   a bias circuit, generating first and second bias voltages;
   an LC resonator circuit, generating an oscillation signal having an oscillation frequency; and
   a current mode logic (CML) frequency divider, coupled to the bias circuit and the LC resonator circuit, biased by the first and second bias voltages, receiving the oscillation signal to generate an output signal having an output frequency with a fractional rate of the oscillation frequency,
   wherein the oscillation signal comprises AC and DC components, the CML frequency divider receives the AC component to determine an injected frequency and reuses the DC component to provide tail currents to determine a natural frequency of the CML frequency divider, and the output frequency is determined by the injected frequency and the natural frequency.

2. The integrated circuit of claim 1, further comprising a decoupling capacitor coupled to a center of an inductor of the LC resonator circuit, providing a virtual ground to an AC signal.

3. The integrated circuit of claim 1, wherein the bias circuit comprises:
   a current source, providing a bias current;
   a bias transistor, coupled to the current source and the CML frequency divider, configured as a current mirror to receive the bias current and generate a mirrored current; and
   a first and a second bias resistor, coupled to the bias transistor and the CML frequency divider, receiving the mirrored current to establish the first and second bias voltage.

4. The integrated circuit of claim 1, wherein the CML frequency divider comprises first and second capacitors, coupling the oscillation signal from the LC resonator circuit to the CML frequency divider.

5. The integrated circuit of claim 1, wherein the CML frequency divider comprises:
   first and second tail transistors, receiving the first and second bias voltages and the oscillation signal to generate first and second tail currents; and
   first and second differential pairs of transistors, coupled to the LC resonator circuit and the first and second tail transistors, receiving the first and second tail currents to generate the output signal.

6. The integrated circuit of claim 1, further comprising a CML buffer coupled to the CML frequency divider.

7. The integrated circuit of claim 1, wherein the oscillation signal and the output signal are differential signals.

8. An apparatus, comprising:
   a phase detector, detecting a phase difference signal between a reference signal and an output signal;
   an LC resonator circuit, coupled to the phase detector, receiving the phase difference signal to generate an oscillation signal having an oscillation frequency;

a bias circuit, generating first and second bias voltages; and a current mode logic (CML) frequency divider, coupled to the bias circuit and the LC resonator circuit, biased by the first and second bias voltages, receiving the oscillation signal to generate the output signal having an output frequency with a fractional rate of the oscillation frequency, wherein the oscillation signal comprises AC and DC components, the CML frequency divider receives the AC component to determine an injected frequency and reuses the DC component to provide tail currents to determine a natural frequency of the CML frequency divider, and the output frequency is determined by the injected frequency and the natural frequency.

9. The apparatus of claim 8, further comprising a decoupling capacitor coupled to a center of an inductor of the LC resonator circuit, providing a virtual ground to an AC signal.

10. The apparatus of claim 8, wherein the bias circuit comprises:

a current source, providing a bias current;

a bias transistor, coupled to the current source and the CML frequency divider, configured as a current mirror to receive the bias current and generate a mirrored current; and a first and a second bias resistors, coupled to the bias transistor and the CML frequency divider, receiving the mirrored current to establish the first and second bias voltage.

11. The apparatus of claim 8, wherein the CML frequency divider comprises first and second capacitors, coupling the oscillation signal from the LC resonator circuit to the CML frequency divider.

12. The apparatus of claim 8, wherein the CML frequency divider comprises:

first and second tail transistors, receiving the first and second bias voltages and the oscillation signal to generate first and second tail currents; and first and second differential pairs of transistors, coupled to the LC resonator circuit and the first and second tail transistors, receiving the first and second tail currents to generate the output signal.

13. The apparatus of claim 8, further comprising a CML buffer coupled to the CML frequency divider.

14. The apparatus of claim 8, wherein the oscillation signal and the output signal are differential signals.

* * * * *